US005266530A

United States Patent [19]

Bagley et al.

[11] Patent Number: 5,266,530

[45] Date of Patent: Nov. 30, 1993

[54] SELF-ALIGNED GATED ELECTRON FIELD EMITTER

[75] Inventors: Brian G. Bagley, Watchung; Robert B. Marcus, Murray Hill; Tirunelveli S. Ravi, Eatontown, all of N.J.

[73] Assignee: Bell Communications Research, Inc., Livingston, N.J.

[21] Appl. No.: 789,747

[22] Filed: Nov. 8, 1991

[51] Int. Cl.[5] ..................... H01L 21/40; H01L 21/461

[52] U.S. Cl. ..................................... 437/228; 437/73; 156/651

[58] Field of Search ............... 437/228, 235; 29/25.01, 29/25.02; 313/309, 310; 445/50, 51

[56] References Cited

U.S. PATENT DOCUMENTS

| | | | |
|---|---|---|---|
| 3,921,022 | 11/1975 | Levine | 313/309 |
| 3,970,887 | 7/1976 | Smith et al. | 313/309 |
| 4,008,412 | 2/1977 | Yuito et al. | 313/309 |
| 4,070,501 | 1/1978 | Corbin et al. | 156/643 |
| 4,357,179 | 11/1982 | Adams et al. | 148/1.5 |
| 4,506,284 | 9/1985 | Shannon | 357/88 |
| 4,532,002 | 7/1985 | White | 156/643 |
| 4,943,343 | 7/1990 | Bardai et al. | 156/643 |
| 4,978,419 | 12/1990 | Nanda et al. | 156/643 |
| 4,983,878 | 1/1991 | Lee et al. | 445/46 |
| 4,995,261 | 2/1991 | Jacobsen et al. | 357/25 |
| 5,007,873 | 4/1991 | Goronkin et al. | 445/49 |
| 5,057,047 | 10/1991 | Greene et al. | 445/24 |

OTHER PUBLICATIONS

R. B. Marcus et al., "Formation of silicon tips with <1 nm radius," Applied Physics Letters, 1990, vol. 56, pp. 236–238.

C. A. Spindt et al., "Physical properties of thin-film field emission cathodes with molybdenum cones," *Journal of Applied Physics,* 1976, vol. 47, pp. 5248–5263.

M. Sokolich et al., "Field emission from submicron emitter arrays," *Proceedings IEDM,* 1990, pp. 159–162.

K. Betsui, "Fabrication and characteristics of Si field emitter arrays", Technical Digest of IVMC 91, pp. 26–29.

S. M. Zimmerman et al., "A Fabrication Method for the Integration of Vacuum Microelectronic Devices", IEEE Transactions on Electron Devices, 1991, vol. 38, pp. 2294–2303.

*Primary Examiner*—Olik Chaudhuri
*Assistant Examiner*—David Mason
*Attorney, Agent, or Firm*—Leonard Charles Suchyta; James W. Falk

[57] ABSTRACT

A method of fabricating a self-aligned gated electron field emitter. An oxidation process forms an optimized, atomically sharp needle (18) in a silicon substrate (12). The needle and surrounding planar area are conformally coated with silicon dioxide (22). A dielectric layer (24) is deposited and planarized over the needle. The dielectric layer is then partially etched away so as to expose the coated needle. The silicon dioxide exposed on the needle is isotropically etched so as to undercut the dielectric layer. A gate metal is directionally deposited so as to form a gate layer (26) on the planar portions of the dielectric layer that is electrically isolated from the gate metal (28) deposited on the needle. The metal on the needle is anodically etched by applying the potential only to the silicon and not to the gate layer. Electro-plating may recoat the needle with another metal (30). The silicon substrate may be replaced by a glass substrate (42) on which is deposited a polysilicon or amorphous silicon layer (40). The invention allows the fabrication of an array of emitters with closely spaced gates over large areas and on inexpensive substrates.

22 Claims, 6 Drawing Sheets

SELF-ALIGNED GATED ELECTRON FIELD EMITTER

FIELD OF THE INVENTION

The invention relates generally to electron field emitters for vacuum microelectronics. In particular, the invention relates to a method of fabricating gates or other electrodes which are self-aligned with the emitters.

BACKGROUND ART

Although semiconductor transistors have largely replaced vacuum tubes, a modern-day version of vacuum tube technology, often referred to as vacuum microelectronics, may find wide application in high-power microwave tubes, flat-panel displays, and other devices.

In vacuum tubes, electrons are thermionically emitted from a hot cathode filament heated by a constant current flowing through it. In a diode, the electrons flow unidirectionally to an anode positively biased with respect to the cathode. In a triode or other gated tube, one or more grids are interposed between the cathode and anode, and small voltage signals applied to the grids have large effects on the current received by the anode. That is, the grid acts as a gate.

Electron field emitters rely on elements with very similar functions, but the cathode is not generally heated. Instead, it is usually formed with a very sharp tip. Then, a relatively small voltage applied between the cathode and anode produces very large electric fields adjacent to the sharp tip. The field is large enough to overcome the surface potential so that large numbers of electrons are emitted. Electron field emitters become particularly attractive because they can be fabricated in dense two-dimensional arrays. Thus, the current emitted from each tip may be small, but the total current may be very large. Furthermore, if a separate gate is provided for each emitter in such an array, a large array could be combined with a multi-color phosphorescent screen, similar to those found in present-day color televisions, to form a high-definition color flat-panel display. Integration of electron field emitters with plasma displays has also been proposed. Gated electron field emitters have other potential applications such as electron-beam writing machines and printers and high frequency amplifiers.

However, many technological problems must be overcome before displays utilizing such field emitters become commercially available. A method is known for making very sharp, but reproducible tips in crystalline silicon. See the technical article by Marcus et al. "Formation of silicon tips with <1 nm radius," *Applied Physics Letters*, volume 56, 1990, pp. 236–238 and U.S. patent application, Ser. No. 07/551,771 filed Jul. 12, 1990, now abandoned in favor of Ser. No. 07/774,361, filed Oct. 8, 1991 by Andreadakis et al., incorporated herein by reference and on which U.S. Pat. Nos. 5,201,992 and 5,204,581 issued Apr. 13 and 20, 1993, respectively. This processing approach, however, suffers a disadvantage of relying upon crystalline silicon, which is satisfactory for arrays of relatively small area, but which is either unavailable or too expensive for flat-panel displays of even moderate size, for example, greater than 20 cm. Furthermore, to take advantage of the small tip sizes, the gates must be relatively closely aligned to the tips. The required alignment is easily achieved by photolithography for small arrays of emitters, but it becomes progressively more difficult when the lithography is extended over several tens of centimeters.

Spindt et al. have disclosed a process for self-aligning emitters in an array of gates in "Physical properties of thin-film field emission cathodes with molybdenum cones," *Journal of Applied Physics*, volume 47, 1976, pp. 5248–5263. However, this process is not only relatively complex, and therefore costly, but it also severely limits the freedom in forming the emitter tip.

Recently, Sokolich et al. have disclosed a process for self-aligning gates in an array of emitters in "Field emission from submicron emitter arrays," *Proceedings IEDM*, 1990, pp. 159–162. They deposit a silicon dioxide layer and a gate metal layer over emitter tips. The tip portion of the gate layer is removed using a planarizing photoresist, and the underlying silicon dioxide is partially etched beneath the metal to expose the tip. Bardai et al. have disclosed a similar process in U.S. Pat. No. 4,943,343. Recently also, Betsui has disclosed a self-aligned process in "Fabrication and characteristics of Si field emitter arrays," *Technical Digest of IVMC*, 1991, pp. 26–29. He deposits a mark to delineate the needle, and the mask is undercut during the sharpening. The cantilevered mask is then used as a shadow mask for deposition of both an insulator and a gate metal, thereby self-aligning the gate with the emitter.

SUMMARY OF THE INVENTION

Accordingly, it is an object of this invention to provide a simple, self-aligned method of forming a gated electron field emitter.

The invention can be summarized as a method of forming a self-aligned gated electron field emitter. A tapered needle is formed in a substrate. Advantageously, silicon, whether it be singly crystalline, polycrystalline, or amorphous, is sharpened by oxidation into a tapered needle having an atomically sharp tip. Silicon dioxide or other insulator is conformally coated on the needle and surrounding planar area. A planarizing dielectric is deposited to sufficient depth such that the coated tip is buried beneath a planar surface. A directional etch removes the planarizing dielectric to a depth such that an upper portion of the coated needle is exposed, but the needle coating is not itself completely etched. The silicon dioxide coating is etched to the extent that the major part of the tapered needle is exposed and that the planarizing dielectric is undercut. Gate metal is directionally deposited so that it covers the planar surface of the dielectric surrounding the needle and the tip of the needle but does not cover the lower portion of the needle protected and shadowed by the undercut. Furthermore, the metal at the side of the needle does not contact the planar portion of the metal so that the needle is electrically isolated from the planar gate. If desired, the metal coated on the needle can be anodically dissolved, and a different metal can be applied to the tip. The invention can be applied to other shapes and compositions of emitters.

DETAILED DESCRIPTION OF THE PREFERRED EMBODIMENTS

The present invention allows a silicon tip to be formed to optimal shape using the silicon-needle sharpening processes of Marcus et al. and Andreadakis et al. Those processes will be briefly described in the initial steps of sequence of steps illustrated in FIGS. 1–11, but the references to Marcus et al. and Andreadakis et al. should be consulted for the details of the processing. However, the invention is not limited to silicon needles.

Figure 1:
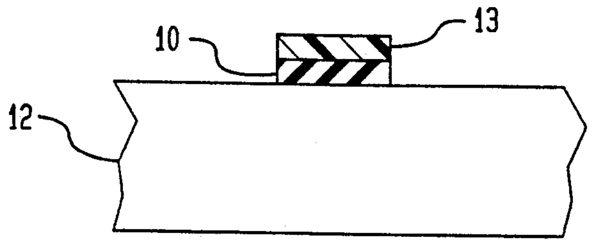
FIGS. 1–11 are cross-sectional views illustrating a sequence of steps used in forming self-aligned gated electron field emitters according to the invention.
Figure 2:
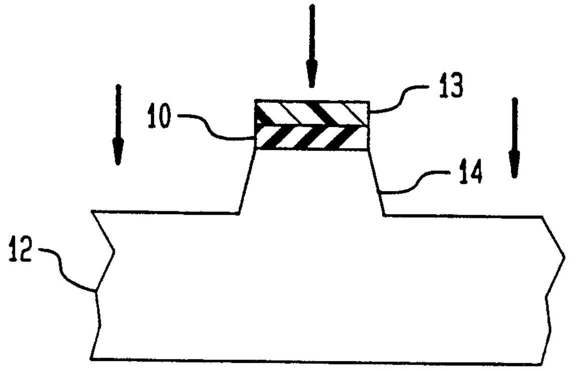
Figure 3:
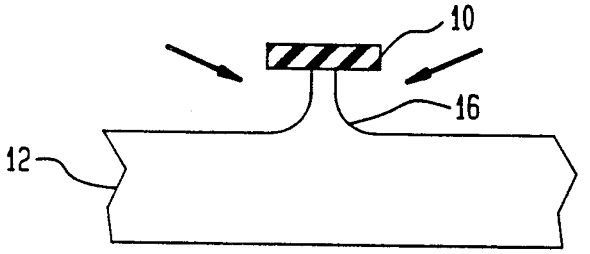
Figure 4:
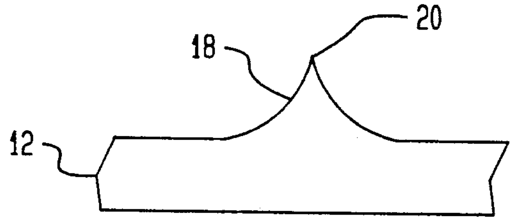

A silicon dioxide layer 10, illustrated in cross-section in FIG. 1, is deposited on a singly crystalline silicon substrate 12 and is overcoated with a photo-resist layer 13. A silicon nitride layer could be substituted for the silicon dioxide. The photo-resist layer 13 is photographically patterned and developed leaving the photo-resist mask 13. Then, as illustrated in FIG. 2, reactive ions or ion milling anisotropically etch the exposed silicon substrate 12 to form a mesa 14 beneath the mask 10. The reactive-ion etching into the substrate 12 is not required, but the etching depth and the width of the mask 10 provide control over the aspect ratio of the needle to be formed. As illustrated in FIG. 3, an isotropic etchant that attacks the silicon 12 but not the silicon dioxide mask 10 is applied for a time determined to leave a blunt needle 16 beneath the mask 10. Thereafter, as illustrated in FIG. 4, an optimally shaped needle 18 is formed through single or multiple steps of oxidation and stripping of the oxide. If desired, a tip 20 on the needle 18 may be formed to be atomically sharp, or the tip 20 may be made rounded to greater or lesser extent.

Figure 5:
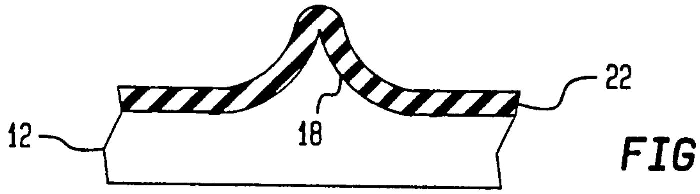

As illustrated in FIG. 5 a silicon dioxide layer 22 is deposited by thermal oxidation, evaporation, or chemical vapor deposition (CVD). The needle 18 and surrounding planar area are conformally coated to a thickness that is substantially larger than the tip diameter but is less than the needle height, for example, in the thickness range of 0.1–0.5 μm for a 1 μm high needle 18. Part of the process of sharpening the needle 18 of FIG. 4 includes oxidizing the less sharpened needle 16 of FIG. 3. Hence, the sharpening oxidation can be combined with the oxide deposition of FIG. 5.

Figure 6:
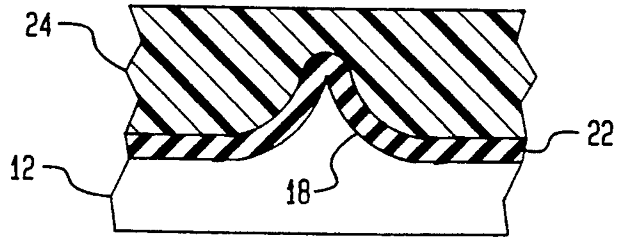

A dielectric layer 24, illustrated in FIG. 6, is then deposited to a thickness such that it covers the coated needle 18 with its top surface nominally planarized on top of the needle 18. Complete planarization is not required, only that any mound in the upper surface of the dielectric layer be considerably shorter than the coated needle 18. The materials for the dielectric layer 24 and the silicon dioxide layer 22, for which other materials may be substituted, must have the following properties: (1) be differentially etchable in different solvents or by reactive-ion etching; (2) permit planarization of the dielectric layer 24 over the sharpened needle 18; (3) be compatible with high vacuum and subsequent processing steps; and (4) have good dielectric strength and low leakage since both layers 24 and 22 act as gate insulators in the final device. Polyimide and spin-on glass have been found to be satisfactory for the dielectric layer 24 in conjunction with the layer 22 of silicon dioxide.

Figure 7:
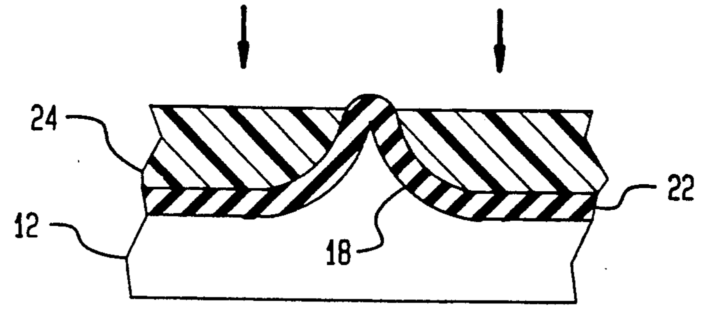

As illustrated in FIG. 7, the dielectric layer 24 is anisotropically etched to a depth such as to expose the silicon dioxide layer 22 around the tip 20 of the needle 18. The etching agent must attack the dielectric layer 24 while leaving the silicon dioxide layer 22 largely intact at the end of etching. When the dielectric layer 24 is spin-on glass, reactive-ion etching works satisfactorily since it attacks silicon dioxide at one-half the rate it attacks the glass. Spin-on glass has the advantage that it is a very good insulator. If the dielectric layer 24 is polyimide, it can be etched with an oxygen plasma, which does not attack silicon dioxide. The precise depth of the etching relative to the tip of the needle 18 depends on the desired height of the emitter tip 20 relative to the gate electrode, as will become apparent later. Preferably, the top of the etched dielectric layer 24 lies level with the tip 20 of the needle 18.

Figure 8:
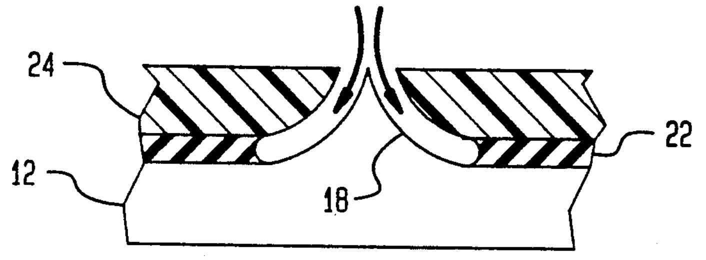

The silicon dioxide layer 22 is then etched, as illustrated in FIG. 8, to a depth such that the dielectric layer 24 is undercut in an area surrounding the needle 18. That is, there are portions of the silicon substrate 12 at the base of the needle 18 that are exposed by the etching but that are vertically overshadowed by the dielectric layer. At a minimum, there should be no upwardly exposed wall of the silicon dioxide 22 completely linking the dielectric layer 24 and the silicon substrate 12. Buffered HF is a satisfactory isotropic etchant which attacks silicon dioxide while leaving intact the polyimide or spin-on glass of the dielectric layer 24.

Figure 9:
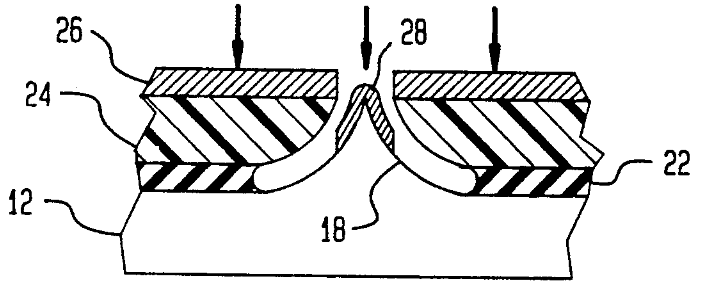

A gate metal is directionally deposited, as illustrated in FIG. 9, such as by a thermal electron beam. Because of the directionality and the undercutting, the gate metal is deposited both as a planar gate layer 26 on top of the dielectric layer 24 and as a metal cap 28 on top of the needle 18. The metal thickness should generally be less than the thickness of the silicon dioxide layer 22 so that the gate layer 26 and the metal cap 28 do not coalesce. The diameter of the opening in the gate layer 26 is controlled by the thickness of the silicon dioxide layer 22.

Figure 10:
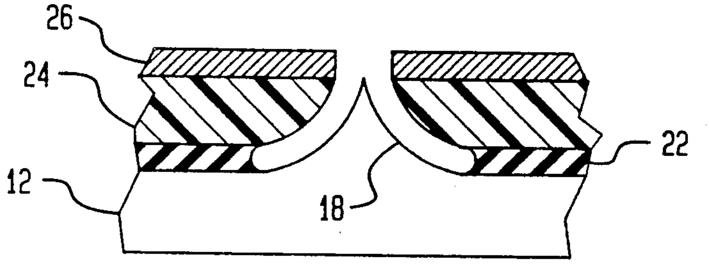

At this stage, the emitter tip 20 is electrically isolated from the gate layer 26 and can be electrically contacted through the conductive silicon substrate 12. In some applications, it may be satisfactory to emit through the needle cap 28. However, it is preferable to remove the needle cap 28 and thus to expose the sharpened needle 18, as illustrated in FIG. 10, by anodically etching the metal on the needle 18. The assembly is immersed in a solvent including an electrolyte, and a positive voltage is applied to the silicon substrate 12 (and associated metal cap 28) relative to a negative electrode also immersed in the solvent. Silicon anodizes at a potential greater than 0.85 V in an aqueous solution according to the reaction $$SiO_2+4H^++4e^-\rightleftarrows Si+2H_2O.$$

Since a higher potential may be needed to dissolve the metal, such as 1.69 V for gold, an aqueous solution can only be used if the silicon is protected against anodization by a surface film such as $TiO_2$. However, in a non-aqueous solvent with neither $H^+$ nor oxygen, a much higher potential can be used. In this case, the solvent should be covered by nitrogen or argon to prevent oxygen absorption into the solvent. One satisfactory non-aqueous solvent is anhydrous acetonitrile, that is, $CH_3—C\equiv N.$ A satisfactory electrolyte is 0.1M TBAB (tetrabutylammonium bromide). The anodic anhydrous etching removes the metal cap 28.

It may be desired to coat the needle 18 with another metal to an optimized thickness, for example, tungsten. Another directional metal deposition would produce a metal cap on the needle 18 similar to the cap 28 of FIG. 9 as well as a metal overcoat on the gate layer 26. However, by a process that is the inverse of anodic etching, a metal overcoat 30, illustrated in FIG. 11, can be electro-plated on only the needle 18, and it will cover all exposed portions of the needle 18. Alternatively, a metal could be coated at a processing stage immediately following the stage illustrated by FIG. 4.

The processing steps described with reference to FIGS. 1-11 require no alignment between the steps. Indeed, only the mask definition of FIG. 1 requires photolithography. Nonetheless, the gate layer 26 is precisely aligned with the tip 20 of the emitter 18 to the precision of the uniformity of the thickness of the silicon dioxide layer 22. For high-power microwave tubes, the emitters can be commonly gated so that no definition of the gate layer 26 would be required. However, for applications in which the emitters need to be individually gated or in which small array pixels need to be separately gated, it would be necessary to photolithographically define the gate layer 26 into electrically isolated gates. But, the accuracy required for this step is related to the spacing between emitters and not to the gate-emitter separation. The described process is further advantageous in the layer thicknesses can be accurately controlled to very small values so that the separation between the emitter and its gate can be controlled over a wide range and can be made very small.

Figure 11:
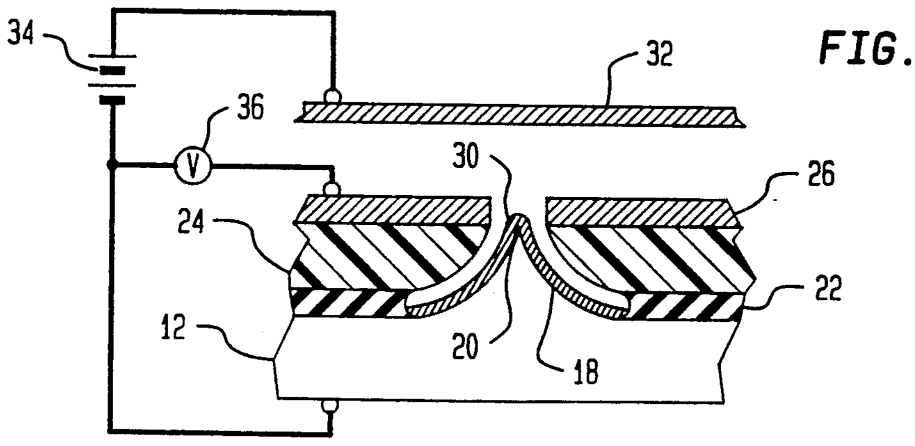

The structure of FIG. 11 can be used as a gated emitter by positioning an anode 32 vertically over the structure. In operation, the anode 32 is biased positively by a DC voltage source 34 relative to the gate layer 26. A signal source 36 applies voltage signals to the gate layer 26. Small signal voltages with a DC bias near critical range within which field emission occurs will cause large variations in current emitted by the needle tip 20 and thus received by the anode 32 or other structure near the anode 32. In one type of flat-panel display, the anode 32 is deposited on a glass substrate and is coated with a phosphor layer facing the emitter structure.

The structure of FIG. 11 without the anode 32 can be used as a diode, that is, the gate layer 26 acts as an anode grid.

EXAMPLE 1

A gated emitter tip was formed and tested as follows. An (100)-oriented crystalline silicon wafer was oxidized at 950° C. for 5 hours in dry $O_2$ to form approximately 100 nm of a planar oxide on top of the silicon. Photoresist was patterned into 2 μm circles above the oxide layer. Reactive-ion etching in a barrel reactor etched through the exposed oxide and formed a 0.6 μm high mesa in the silicon. The etching gas was $C_2F_6$, the power was 100 W, and the flow rate maintained the gas pressure at 30 mT so as to produce an etching rate of about 20 nm/min over 30 minutes. The photo-resist was softened with an oxygen plasma and removed with acetone and methanol.

The masked mesa was isotropically etched with a solution of $HF:CH_3COOH:HNO_3$ (2:3:95, by volume) for 3 minutes so as to produce the blunt silicon needle. The blunt needle was oxidatively sharpened by exposing it at 950° C. to dry $O_2$ for 5½ hours. This oxidation was performed three times with the oxide being removed each time with buffered HF.

Plasma-enhanced chemical vapor deposition (PECVD) performed at 300° C. using the gases $SiH_4$, Ar, and $O_2$ deposited a conformal $SiO_2$ layer. Eighty minutes of deposition formed the $SiO_2$ to a thickness of about 400 nm.

A solution for a spin-on glass containing 41 wt % solids of a ladder siloxane having monomeric composition $Si_2O_3(CH_3)_2$ and available from OI-NEG as glass resin type GR-650 was dissolved in a solvent of ethanol and butanol (1:1, by volume). The solution was spun on the top surface of the Si wafer at 4000 r.p.m., and the coated wafer was cured at 130° C. for one-half hour. The thickness of the spin-on glass was estimated to be 2.9 μm. Decreasing the solid content would decrease the viscosity while increasing the spin speed would increase the liquid's thickness. Thus, a desired thickness is obtained by balancing the amount of dissolved polymer against the spin speed. The ladder siloxane can be cured between 100° and 300° C., with decreasing curing time at increasing temperature. Linear siloxanes could alternatively be used although they are rubbery at room temperature.

The previously described reactive-ion etching was performed for 32 minutes. Its etching rates were 65 nm/min for spin-on glass and 25 nm/min for the CVD oxide. This etching exposed the CVD oxide at the tip and left the surface of the spin-on glass at a level slightly below the tip, at the desired gate layer location. The structure was then immersed in buffered HF for three minutes to etch the exposed CVD oxide. The etch produced a gate opening around the needle of about 1 μm, which is the sum of the silicon needle diameter at that height and twice the $SiO_2$ thickness.

An e-beam evaporator deposited 20 nm of Ti and then 180 nm of Au on the wafer die held nearly at room temperature. The wafer die was oriented so that the atoms arrived perpendicularly to its surface. The Au on the needle was electro-etched in aqueous solution using the silicon as the anode. The electrolytic solution was $HCl:H_2O$ (13:87, by volume). The voltage of 3 V was applied for 45 seconds. The oxidized Ti was removed by immersion in buffered HF for 1 minute. No electroplating was attempted.

Figure 12:
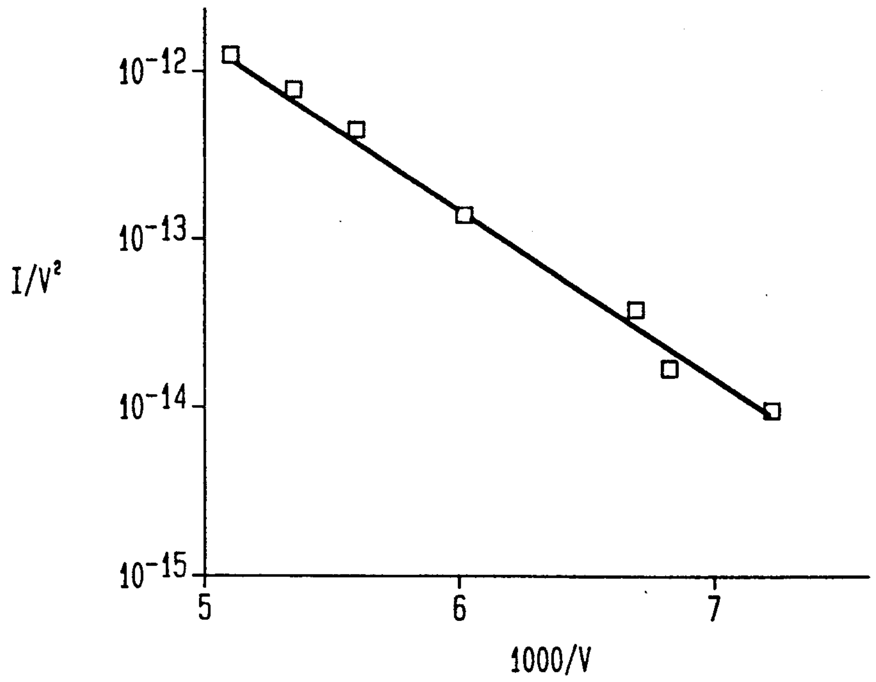
FIG. 12 is a graph of data demonstrating Fowler-Nordheim field emission from an example of the invention.

The gated emitter of the example was tested as a diode; that is, a positive voltage was applied to the gate layer 26 relative to the substrate 12. FIG. 12 shows the measured current-voltage with the vertical axis logarithmically expressed in terms of $I/V^2(A \cdot V^{-2})$ and the horizontal axis in terms of $1000/V(V^{-1})$. The data closely follow a linear Fowler-Nordheim relationship which demonstrates electron field emission.

The processing steps described above can be modified in various aspects. The spin-on glass for the dielectric layer could be based on the phosphorus or boron doped spin-on glass disclosed by Bagley et al. in U.S. Pat. No. 4,885,186. The siloxane is then converted to a pure oxide by plasma or pyrolysis, and the glass is reflowed. Alternatively, the wafer could be spin-coated with a ladder siloxane, which is then cured without being converted to a pure oxide. If the ladder siloxane is exposed to an oxygen plasma for 10 seconds with no energetic species, the ladder siloxane becomes etchable in HF solutions.

Figure 13:
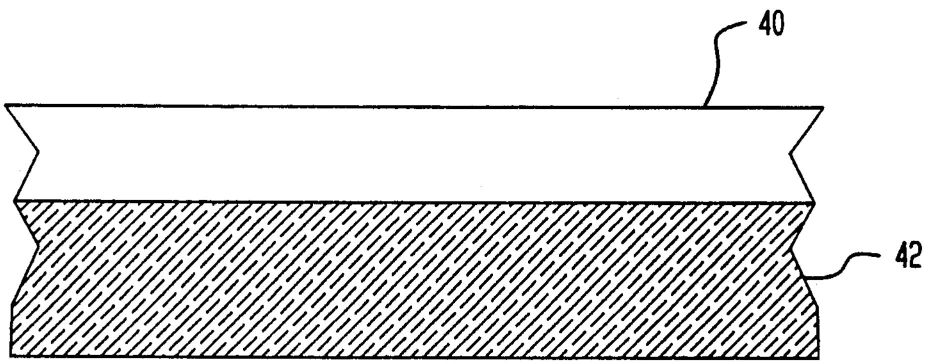
FIGS. 13 and 14 are cross-sectional views illustrating forming gated electron field emitters in a deposited silicon film.
Figure 14:
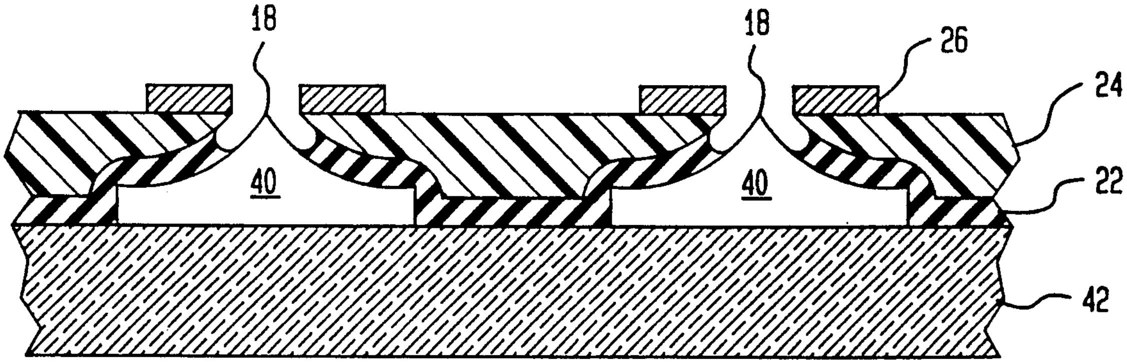

The invention may be applied to polycrystalline and amorphous silicon, rather than singly crystalline silicon. As illustrated in cross-section in FIG. 13, a layer 40 of doped amorphous silicon is deposited on a glass substrate 42. Then the steps of FIGS. 1 through 10 are followed to produce a large array of electron field emitters 18, as illustrated in cross-section in FIG. 14. Additionally, the emitters 18 or rows of emitters 18 may, as illustrated, be isolated by an initial isolating etch through the silicon layer 40 to the glass substrate 42 and by a final definition of the electrode layer 26. Offset contacts to the isolated portions of the silicon layer 40 are not illustrated. This embodiment offers the advantage of large and inexpensive substrates. The polysilicon or amorphous silicon can be inexpensively deposited by CVD using well known techniques, such as that described by Adams et al. in U.S. Pat. No. 4,357,179.

EXAMPLE 2

The sharpening of polysilicon was demonstrated. A 0.8 μm film of $SiO_2$ was thermally oxidized in a surface of a crystalline silicon wafer. A 3 μm film of undoped polycrystalline silicon (polysilicon) was deposited by CVD on the oxide film. A needle was defined and sharpened in the polysilicon, generally following the steps of FIGS. 1 through 4. The polysilicon was isotropically etched with the same etchant as Example 1 and was thermally oxidized in dry oxygen at 950° C. for 5½ hours, and the oxide was stripped in buffered HF. The oxidizing and stripping were repeated. Scanning electron micrographs showed relatively sharp and uniform needles although serrations appeared at the polycrystalline grain boundaries. Better needles can be formed in deposited amorphous silicon, doped using phosphine during deposition or with $POCl_3$ or $PBr_3$, either between the shaping steps of etching and oxidizing or even after the oxidizing. The remaining steps in forming a gated emitter are not affected by the non-single-crystalline nature of the silicon.

The inventive self-aligned gated emitter is relatively simple to produce using techniques well developed in the semiconductor industry. Unlike the method of Sokolich et al., the inventive self-aligned process leaves a more rugged planar surface with no unsupported metal layers, allows reduced capacitance and leakage between the gate and the substrate. The method of Betsui controls the gate-emitter separation by the lateral dimension of the mask, which also determines the emitter height. On the other hand, the inventive process decouples the gate-emitter separation from the needle height and therefore more accurately controls the separation by the more accurately controlled oxide thickness, which does not need to have any relation to the emitter height. In the first example, a 2 μm mask was used to generate a 1 μm high emitter with a 0.5 μm opening.

The triode structure illustrated in FIG. 11 may not be satisfactory when used with a phosphor screen, for which high voltages are needed for bright images. To prevent breakdown, the anode must be separated from the emitter by a relatively large space, which would broaden the emitted beam into an unacceptably large pixel size on the screen. However, a tetrode structure could overcome the broadening by using a second intermediate electrode to focus the beam, as has been disclosed by Zimmerman et al. in "A Fabrication Method for the Integration of Vacuum Microelectronic Devices", IEEE *Transactions on Electron Devices*, volume ED-38, 1991, pp. 2294–2303. Such a lens electrode could be fabricated in a number of ways.

Figure 15:
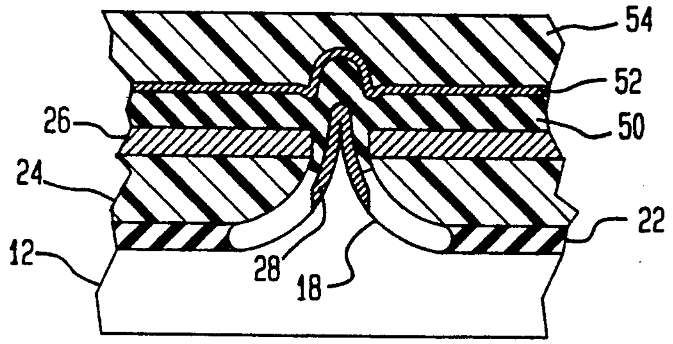
FIGS. 15–18 are cross-sectional views illustrating a first self-aligned process of forming a tetrode structure.
Figure 16:
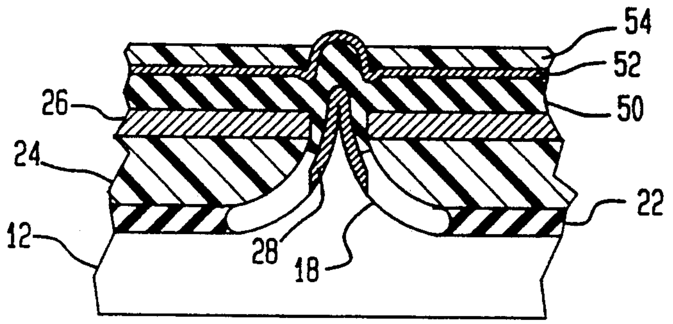
Figure 17:
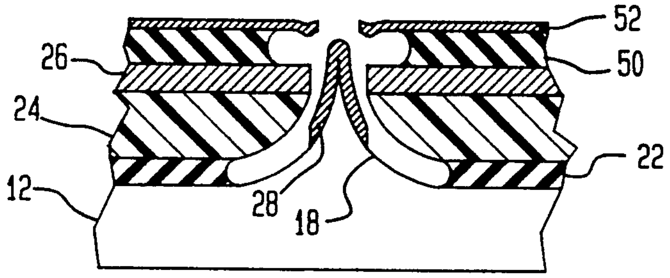
Figure 18:
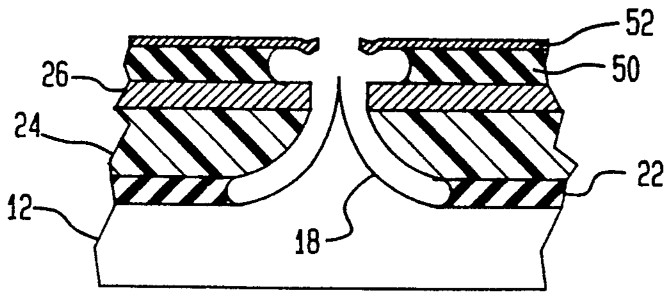

As illustrated in cross-section in FIG. 15, the processing of the steps of FIGS. 1-9 is adjusted so that the metal cap 28 extends significantly above the first gate metal 26. An $SiO_2$ layer 50 is conformally deposited so that a bump is produced above the center of the needle 18. A second gate metal 52 is deposited on the $SiO_2$ layer and is planarized by a second planarizing layer 54. As illustrated in FIG. 16, the planarizing layer 54 is removed down to near the bump in the second gate metal 54, and the bump is exposed. As illustrated in FIG. 17, the exposed second gate metal 54 is etched away. The now exposed $SiO_2$ is partially iostropically etched with buffered HF so as to expose the needle 18. Any remaining second planarizing layer 54 is removed. As illustrated in FIG. 18, the metal cap 28 is anodically removed, as was done in FIG. 10. The height of standoff of the focusing second gate metal 54 can be adjusted by varying the thickness of the second $SiO_2$ layer 50.

Figure 19:
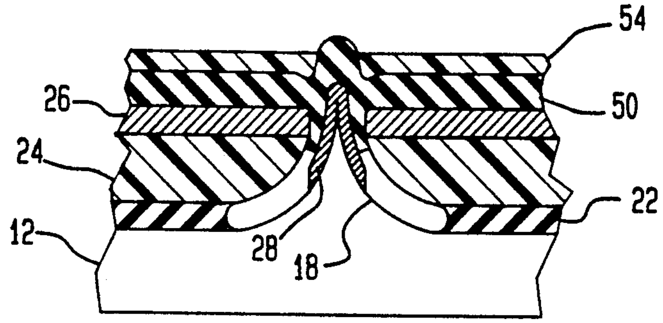
FIGS. 19 and 20 are cross-sectional views illustrating a second self-aligned process of forming a tetrode structure.
Figure 20:
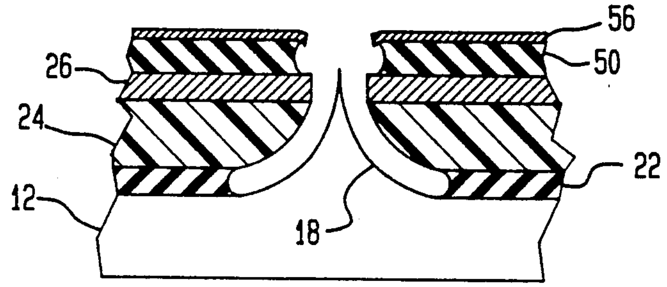

A second self-aligned process for forming the tetrode structure reverses the metal deposition and $SiO_2$ etching. As illustrated in FIG. 19, the second planarizing layer 54 is deposited directly on the conformal $SiO_2$ layer 50 and is partially removed to expose a bump in the $SiO_2$ layer 50 overlying the central part of the needle 18. As illustrated in FIG. 20, buffered HF partially removes the exposed $SiO_2$ layer 50. The remnants of the second planarizing layer 54 are removed. A second gate metal is directionally deposited into a second gate layer 56 and an overcap over the metal cap 28. The cap 28 and overcap are anodically removed from the needle 18.

Figure 21:
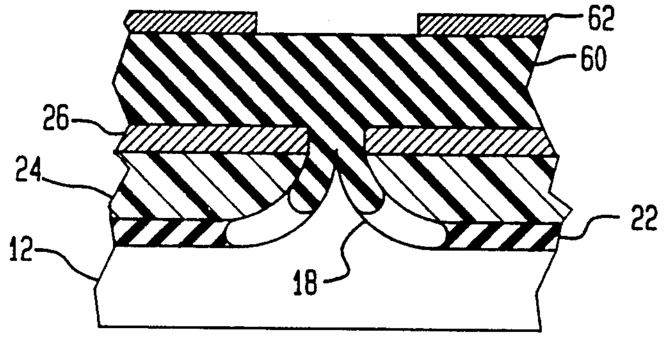
FIGS. 21 and 22 are cross-sectional views illustrating a non-self-aligned process of forming a tetrode structure.
Figure 22:
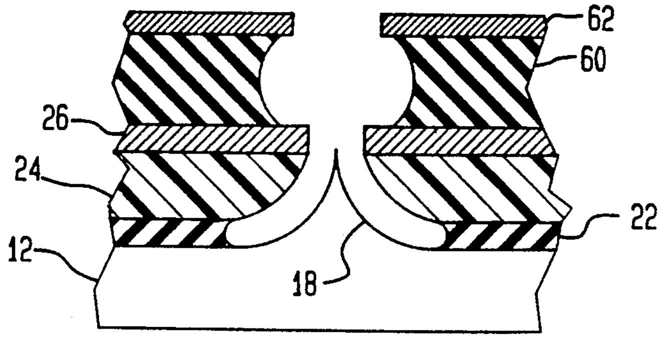

A non-self-aligned process provides extra flexibility. As illustrated in FIG. 21, a second $SiO_2$ layer is deposited over the structure of FIG. 10. It need not be conformal. A metal layer is then deposited and photolithographically defined into a focusing second gate electrode 62 with an aperture centered over the needle 18. As illustrated in FIG. 22, the thus exposed second $SiO_2$ layer 60 is first dry etched and then wet etched with buffered HF to remove all of the $SiO_2$ in the region of the electron beam. This process allows wide and independent control of the aperture in the second gate electrode 62, its standoff from the first gate electrode 26, and the height of the emitter tip relative to the gate electrode 26.

Although a circularly symmetric, two-dimensional needle was fabricated in the examples, the invention is equally applicable to pyramidally shaped needles, multiple tip structures (2 or 4 needles per pyramid or cone), and one-dimensional needles, that is, ridges extending in straight or curved lines. Although the invention is particularly useful with silicon needles oxidatively sharpened from a silicon substrate, the invention may be applied to other types of needles, for example, metal needles sharpened by plasma discharge.

What is claimed is:

1. A method for forming a self-aligned electron-emitter structure, comprising the steps of:

forming a needle connected to and rising over a body, said needle forming an electron emitter of said electron-emitter structure;

conformally forming a first insulating material over said needle and body;

depositing and substantially planarizing a second insulating material over said first insulating material;

removing a portion of said second insulating material so as to expose a portion of said first insulating material;

etching said exposed first insulating material so as to form an undercut underlying said second insulating material; and then directionally depositing a metal over said second insulating material to form a major portion of at least an electrode layer for said electron-emitter structure over said second insulating material, self-aligned with said electron emitter, and having an aperture therethrough overlying said needle for passage of electrons, said directionally depositing preventing said metal from being deposited on a lower portion of said insulating material overhanging said undercut.

2. A method as recited in claim 1, wherein said needle and said body both comprise silicon and said needle is formed in said body.

3. A method as recited in claim 2, wherein said silicon body comprises singly crystalline silicon.

4. A method as recited in claim 2, wherein a portion of said silicon body comprising said needle comprises polycrystalline silicon.

5. A method as recited in claim 4, further comprising depositing said silicon body as a film on a substrate.

6. A method as recited in claim 2, wherein a portion of said silicon body comprising said needle substantially consists of amorphous silicon.

7. A method as recited in claim 6, further comprising depositing said silicon body as a film on a substrate.

8. A method as recited in claim 2, wherein said step of depositing and planarizing comprises:

spinning on top of said silicon dioxide a liquid containing a polymer; and curing said liquid to form a glass.

9. A method as recited in claim 8, wherein said second insulating material comprises spin-on glass.

10. A method as recited in claim 8, wherein said second insulating material comprises polyimide.

11. A method as recited in claim 1, wherein said removing step exposes said needle.

12. A method as recited in claim 11, wherein said directionally depositing step deposits a first portion of said metal over said second insulating material and a second portion of said metal over said needle, said first and second portions being electrically isolated, and further comprising anodically etching said second portion.

13. A method as recited in claim 1, further comprising the steps of:

conformally forming a third insulating material over said directionally deposited metal;

depositing a second metal over said third insulating material;

depositing and substantially planarizing a planarizing material over said second metal;

removing a portion of said planarizing material and a portion of said second metal so as to expose a portion of said third insulating material over said needle; and etching said exposed third insulating material.

14. A method as recited in claim 1, further comprising the steps of:

conformally forming a third insulating material over said directionally deposited metal;

depositing and substantially planarizing a planarizing material over said third insulating material;

removing a portion of said planarizing material so as to expose a portion of said third insulating material over said needle;

etching said third insulating material; and then directionally depositing a second metal.

15. A method as recited in claim 1, further comprising the steps of:

depositing a third insulating material over said directionally deposited metal, said third insulating material overlying a central portion of said needle;

depositing and defining a second gate metal over said third insulating material and having an aperture over said central portion of said needle so as to expose a portion of said third insulating material;

etching said exposed portion of said third insulating material; and then directionally depositing a second metal.

16. A method of forming a gate electrode self-aligned with an electron field emitter, comprising the steps of:

forming a mask over an intended emitter area in a silicon body;

isotropically etching said silicon body around said mask;

oxidizing said etched silicon body to form a silicon needle forming an electron emitter;

conformally depositing a silicon dioxide layer on said silicon needle;

depositing and substantially planarizing a dielectric layer over said needle;

removing said dielectric layer to a depth such as to expose said silicon needle on which said silicon dioxide layer is conformally deposited;

etching said silicon dioxide layer with an etching agent that is less reactive with said dielectric layer than with said silicon dioxide layer and to a depth such that said silicon needle is exposed and said dielectric layer is undercut; and depositing a gate metal on an upper surface of said dielectric layer and an upper portion of said exposed silicon needle, said gate metal deposited on said dielectric layer forming a major portion of a gate electrode, and having an aperture therethrough overlying said needle for passage of electrons.

17. A method as recited in claim 1, wherein said forming step forms said needle to have a tip disposed over a solid and planar portion of said body.

18. A method as recited in claim 1, wherein said removing step removes upper portions of all of said second insulating material operatively associated with said electron-emitter structure.

19. A method as recited in claim 1, wherein said directionally depositing step deposits said metal directly onto said second insulating material.

20. A method as recited in claim 19, wherein said removing step removes only a vertical portion of said first insulating material overlying a peripheral area surrounding a bottom of said needle but removes an entire vertical extent of said first insulating material overlying a tip of said needle.

21. A method as recited in claim 1, wherein said forming step comprises forming a blunt needle connected to and rising over said body and oxidatively sharpening said blunt needle.

22. A method as recited in claim 7, wherein said substrate is a glassy substrate.

* * * * *